United States Patent
Kang et al.

(10) Patent No.: US 8,372,699 B2
(45) Date of Patent: Feb. 12, 2013

(54) METHOD FOR FORMING A SPLIT-GATE MEMORY CELL

(75) Inventors: Sung-Taeg Kang, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/710,111

(22) Filed: Feb. 22, 2010

(65) Prior Publication Data

US 2011/0207274 A1    Aug. 25, 2011

(51) Int. Cl.
*H01L 21/336* (2006.01)
*H01L 21/3205* (2006.01)

(52) U.S. Cl. ........ 438/144; 438/267; 438/288; 438/596; 257/E21.21; 257/E21.679

(58) Field of Classification Search .................. 438/267, 438/288, 596; 257/E21.21, E21.679
See application file for complete search history.

(56) References Cited

U.S. PATENT DOCUMENTS

| | | | |
|---|---|---|---|
| 5,020,030 A * | 5/1991 | Huber | 365/185.08 |
| 5,408,115 A * | 4/1995 | Chang | 257/324 |
| 5,585,293 A * | 12/1996 | Sharma et al. | 438/261 |
| 6,816,414 B1 | 11/2004 | Prinz et al. | |
| 6,930,003 B2 * | 8/2005 | Yamamukai | 438/267 |
| 7,416,945 B1 * | 8/2008 | Muralidhar et al. | 438/267 |
| 7,456,465 B2 * | 11/2008 | Prinz et al. | 257/315 |
| 7,524,719 B2 | 4/2009 | Steimle et al. | |
| 7,579,243 B2 * | 8/2009 | Kang et al. | 438/267 |
| 7,795,091 B2 * | 9/2010 | Winstead et al. | 438/257 |
| 2004/0084710 A1 * | 5/2004 | Baker et al. | 257/311 |
| 2004/0183122 A1 * | 9/2004 | Mine et al. | 257/315 |
| 2007/0218633 A1 * | 9/2007 | Prinz et al. | 438/267 |
| 2007/0257307 A1 * | 11/2007 | Chen | 257/324 |

* cited by examiner

*Primary Examiner* — Charles Garber
*Assistant Examiner* — Ron Pompey
(74) *Attorney, Agent, or Firm* — Daniel D. Hill

(57) ABSTRACT

A method for forming a semiconductor device includes forming a first semiconductor layer over a substrate, forming a first photoresist layer over the first semiconductor layer, and using only a first single mask patterning the first photoresist layer to form a first patterned photoresist layer. The method further includes using the first patterned photoresist layer etching the first semiconductor layer to form a select gate and forming a charge storage layer over the select gate and a portion of the substrate. The method further includes forming a second semiconductor layer over the charge storage layer, forming a second photoresist layer over the second semiconductor layer, and using only a second single mask patterning the second photoresist layer to form a second patterned photoresist layer. The method further includes forming a control gate by anisotropically etching the second semiconductor layer and then subsequently isotropically etching the second semiconductor layer.

20 Claims, 5 Drawing Sheets

METHOD FOR FORMING A SPLIT-GATE MEMORY CELL

BACKGROUND

1. Field

This disclosure relates generally to semiconductor processing, and more specifically, to a method for forming a split-gate memory.

2. Related Art

A split-gate non-volatile memory cell includes a control gate and a select gate for controlling program, erase, and read operations. The control gate is used to control programming and erasing of the memory cell while the select gate is used to select when a memory cell is programmed or read. A prior art manufacturing process uses a three mask lithography process to form the two gates. Other processes may include the use of sacrificial features in addition to the three lithography processes. Alignment of each of the three masks is important. Any misalignment can cause uncontrolled select gate length and control gate length, which may result in variations in threshold voltage (VT) and leakage current as well as degraded manufacturing yield. One prior art split-gate memory cell includes two polysilicon layers, where a portion of one polysilicon layer overlaps with a portion of the other layer. Any misalignment in the masks used to form the select and control gates may require etching through different polysilicon thicknesses on either side of the split-gate memory cells, resulting in either under etching or over etching the polysilicon. In addition, the use of a three mask lithography process increases costs because of repeated steps and increased manufacturing time.

Therefore, what is needed is a method for forming a split-gate memory cell that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
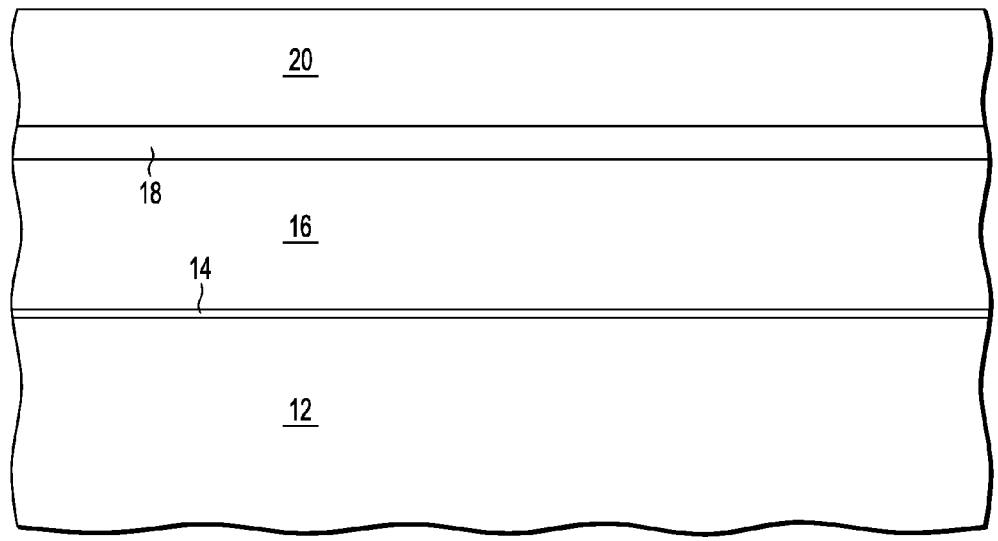
FIGS. 1-10 illustrate a method for forming a split-gate memory cell in accordance with an embodiment.

Generally, there is provided, a method for forming a split-gate memory cell using only a two mask lithography process. The first mask is used to pattern a select gate polysilicon photoresist layer. An anisotropic etch process is used to form the select gate after patterning the select gate photoresist layer. The second mask is used to pattern a control gate polysilicon layer. A combination of anisotropic and isotropic etch processes are used to remove the control gate polysilicon layer. The anisotropic etch process is used first to remove most of the control gate polysilicon layer. The isotropic etch process is then used to remove residual control gate polysilicon left over from regions that are not masked. The split-gate memory cell may be used in a memory that is embedded with other devices, such as for example, logic gates.

Using the disclosed two mask lithography process to form a split gate memory cell results in more consistent critical dimension (CD) control and mask alignment. Better alignment results in more consistent gate lengths and threshold voltages as well as reduced manufacturing cost. Better alignment also results in less leakage current and increased manufacturing yields.

In one aspect, there is provided, a method of forming a semiconductor device, the method comprising: forming a first semiconductor layer over a substrate; forming a first photoresist layer over the first semiconductor layer; using only a first single mask, patterning the first photoresist layer to form a first patterned photoresist layer; using the first patterned photoresist layer, etching the first semiconductor layer to form a select gate; forming a charge storage layer over the select gate and a portion of the substrate; forming a second semiconductor layer over the charge storage layer; forming a second photoresist layer over the second semiconductor layer; using only a second single mask patterning the second photoresist layer to form a second patterned photoresist layer; forming a control gate by anisotropically etching the second semiconductor layer and then subsequently isotropically etching the second semiconductor layer. The method may further comprise forming an anti-reflective coating (ARC) layer overlying the second semiconductor layer and using the ARC layer as a hard mask for anisotropically etching the second semiconductor layer. The method may further comprise, prior to forming the first semiconductor layer over the substrate, forming a dielectric layer over the substrate. The method may further comprise: forming a first anti-reflective coating (ARC) layer overlying the first semiconductor layer; forming a second ARC layer overlying the second semiconductor layer; and using the second ARC layer as a hard mask for anisotropically etching the second semiconductor layer. The step of anisotropically etching the second semiconductor layer may create a sidewall of the second semiconductor layer, wherein the sidewall has a bottom portion and a top portion, and wherein the bottom portion extends beyond the top portion in a horizontal direction resulting in a non-perpendicular sidewall. The step of isotropically etching the second semiconductor layer may make the non-perpendicular sidewall substantially perpendicular. The control gate may be located on a first side of the select gate and wherein the step of anisotropically etching the second semiconductor layer leaves a residual portion of the second semiconductor layer, wherein the residual portion of the second semiconductor layer may be located on a second side of the select gate, wherein the second side is opposite to the first side. The step of isotropically etching the second semiconductor layer may substantially remove the residual portion. The charge storage layer may comprise nanocrystals.

In another aspect, there is provided, a method of forming a semiconductor device, the method comprising: forming a first semiconductor layer over a substrate; forming a dielectric layer over the substrate and below the first semiconductor layer; forming a first photoresist layer over the first semiconductor layer; using only a first single mask patterning the first photoresist layer to form a first patterned photoresist layer; using the first patterned photoresist layer etching the first semiconductor layer and the dielectric layer to form a select gate; forming a charge storage layer over the select gate and a portion of the substrate; forming a second semiconductor layer over the charge storage layer; forming a second photoresist layer over the second semiconductor layer; using only a second single mask patterning the second photoresist layer to form a second patterned photoresist layer; forming a control gate by anisotropically etching the second semiconductor layer and then subsequently isotropically etching the second semiconductor layer, wherein the step of anisotropically etching the second semiconductor layer creates a sidewall of the second semiconductor layer, wherein the sidewall has a bottom portion and a top portion, wherein the bottom portion extends beyond the top portion in a horizontal direction resulting in a non-perpendicular sidewall, and wherein the step of isotropically etching the second semiconductor layer makes the non-perpendicular sidewall substantially perpendicular. The method may further comprise forming an anti-reflective coating (ARC) layer overlying the second semiconductor layer and using the ARC layer as a hard mask for anisotropically etching the second semiconductor layer. The method may further comprise: forming a first anti-reflective coating (ARC) layer overlying the first semiconductor layer; forming a second ARC layer overlying the second semiconductor layer; and using the second ARC layer as a hard mask for anisotropically etching the second semiconductor layer. The control gate may be located on a first side of the select gate and wherein the step of anisotropically etching the second semiconductor layer leaves a residual portion of the second semiconductor layer, wherein the residual portion of the second semiconductor layer is located on a second side of the select gate, wherein the second side is opposite to the first side. The step of isotropically etching the second semiconductor layer may substantially remove the residual portion.

In yet another aspect, there is provided, a method of forming a semiconductor device, the method comprising: forming a first semiconductor layer over a substrate; forming a dielectric layer over the substrate and below the first semiconductor layer; forming a first photoresist layer over the first semiconductor layer; using only a first single mask patterning the first photoresist layer to form a first patterned photoresist layer; using the first patterned photoresist layer etching the first semiconductor layer and the first dielectric layer to form a select gate; forming a charge storage layer over the select gate and a portion of the substrate; forming a second semiconductor layer over the charge storage layer; forming a second photoresist layer over the second semiconductor layer; using only a second single mask patterning the second photoresist layer to form a second patterned photoresist layer; forming a control gate by anisotropically etching the second semiconductor layer and then subsequently isotropically etching the second semiconductor layer, wherein the control gate is located on a first side of the select gate and wherein the step of anisotropically etching the second semiconductor layer leaves a residual portion of the second semiconductor layer, wherein the residual portion of the second semiconductor layer is located on a second side of the select gate, wherein the second side is opposite to the first side, and wherein the step of isotropically etching the second semiconductor layer substantially removes the residual portion. The method may further comprise forming an anti-reflective coating (ARC) layer overlying the second semiconductor layer and using the ARC layer as a hard mask for anisotropically etching the second semiconductor layer. The method may further comprise: forming a first anti-reflective coating (ARC) layer overlying the first semiconductor layer; forming a second ARC layer overlying the second semiconductor layer; and using the second ARC layer as a hard mask for anisotropically etching the second semiconductor layer. The step of anisotropically etching the second semiconductor layer may create a sidewall of the second semiconductor layer, wherein the sidewall has a bottom portion and a top portion, and wherein the bottom portion extends beyond the top portion in a horizontal direction resulting in a non-perpendicular sidewall. The step of isotropically etching the second semiconductor layer may make the non-perpendicular sidewall substantially perpendicular. The charge storage layer may comprise nanocrystals.

FIG. 1 illustrates a cross-sectional view of a semiconductor device 10 after forming various semiconductor layers of a thin film split-gate memory cell. Semiconductor device 10 includes semiconductor substrate 12, gate dielectric layer 14, polysilicon layer 16, nitride anti-reflective coating (ARC) layer 18, and photoresist layer 20. The semiconductor substrate 12 described herein can be any semiconductor material or combinations of materials, such as gallium arsenide, silicon germanium, silicon-on-insulator (SOI), silicon, monocrystalline silicon, the like, and combinations of the above. In another embodiment, substrate 12 may be a well in a semiconductor substrate. The dielectric layer 14 may be any suitable gate dielectric. Gate dielectric layer 14 is either grown and/or deposited. In one embodiment, gate dielectric layer 14 is grown silicon dioxide. Polysilicon layer 16 is deposited on gate dielectric layer 14 to a thickness of between 1000 and 2000 angstroms. In one embodiment, polysilicon layer 16 is 1500 angstroms thick. ARC layer 18 is a conventional ARC layer and can be organic or inorganic and may provide a hard mask for polysilicon layer 16. Photoresist layer 20 is formed on polysilicon layer 16. In one embodiment, photoresist layer 20 is characterized as being 193 nanometer (nm) photoresist for use in a 193 nm lithography process. In an embedded application, polysilicon layer 16 may be used to form a select gate for a split-gate memory cell, while also being used to form logic gates in another portion of an integrated circuit having the split-gate memory cell. The logic gates may be formed using a conventional complementary metal-oxide semiconductor (CMOS) process.

Figure 2:
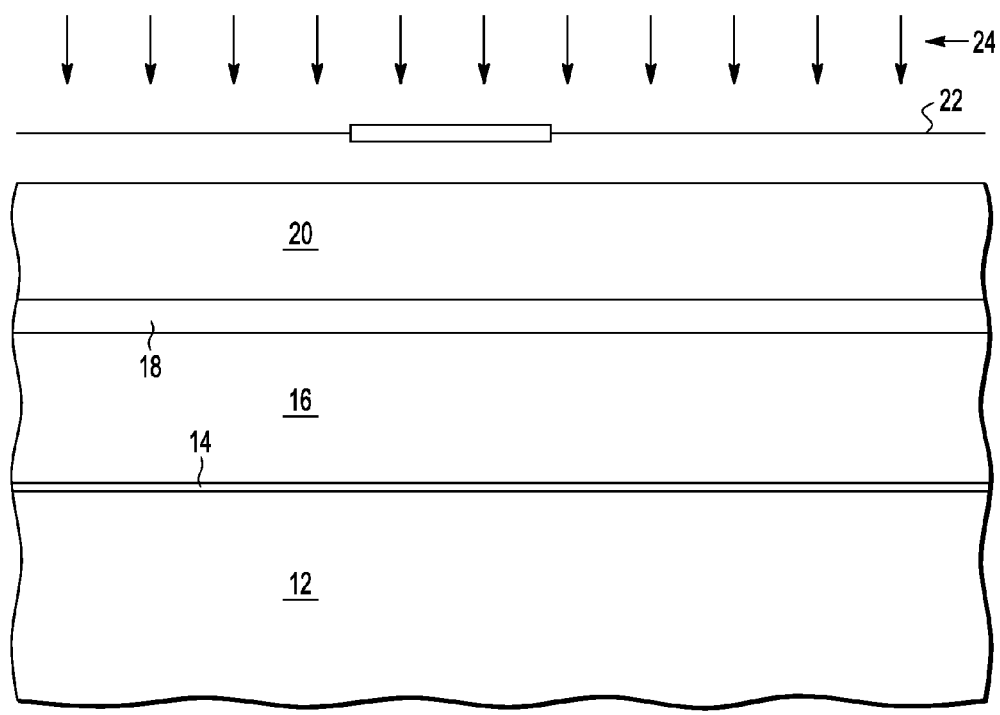

FIG. 2 illustrates a cross-sectional view of semiconductor device 10 when radiation 24 is applied to the semiconductor device 10 through a photomask 22 during the first lithography process. In one embodiment, radiation 24 is 193 nm deep ultraviolet (DUV) light used in a 193 nm lithography process.

Figure 3:
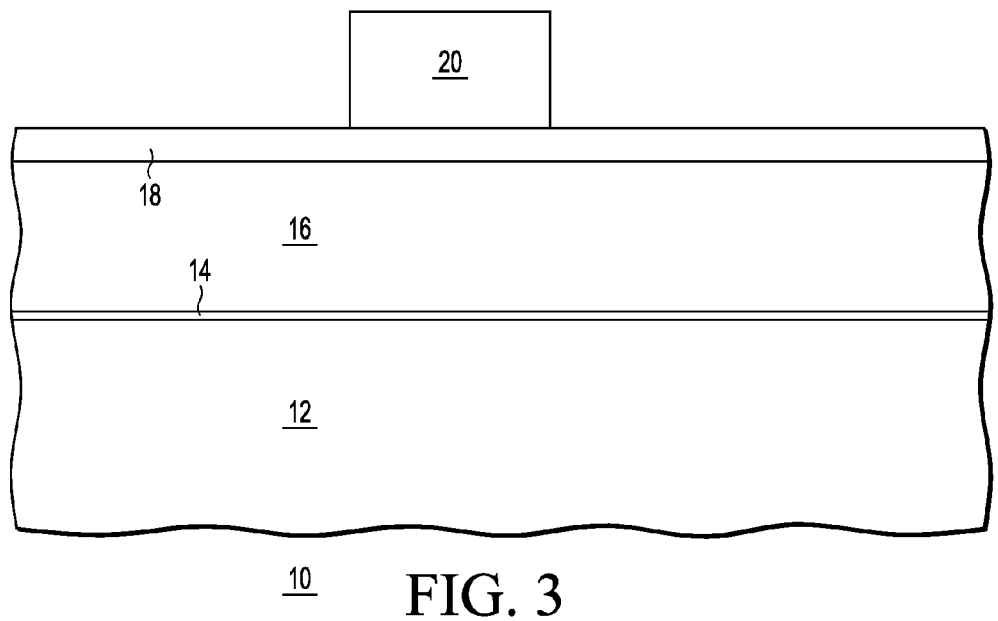

FIG. 3 illustrates a cross-sectional view of semiconductor device 10 after photoresist layer 20 is patterned to form a polysilicon select gate of a split-gate memory cell.

Figure 4:
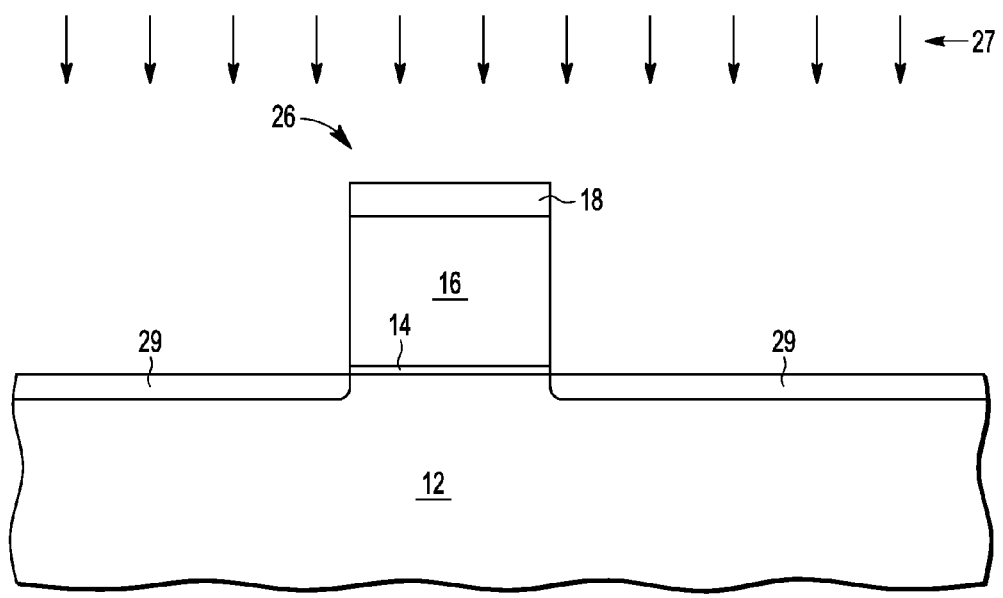

FIG. 4 illustrates a cross-sectional view of semiconductor device 10 after select gate 26 is formed. In FIG. 4, an anisotropic etching process is used to etch and remove polysilicon layer 16 from areas not covered by photoresist 20. Photoresist 20 is removed using a conventional photoresist removing process. A conventional pre-clean process is then used to remove the exposed gate dielectric 14 from over substrate 12. Patterned polysilicon layer 16, gate dielectric 14, and ARC 18 then form select gate 26 of a split-gate memory cell. Doped regions 29 are formed by implanting a dopant 27 in substrate 12. In one embodiment, doped regions 29 are formed prior to removing gate dielectric 14. In one embodiment, dopant 27 is an n-type dopant used to alter a threshold voltage (VT) of a p-type substrate. In another embodiment, dopant 27 may not be applied to substrate 12.

Figure 5:
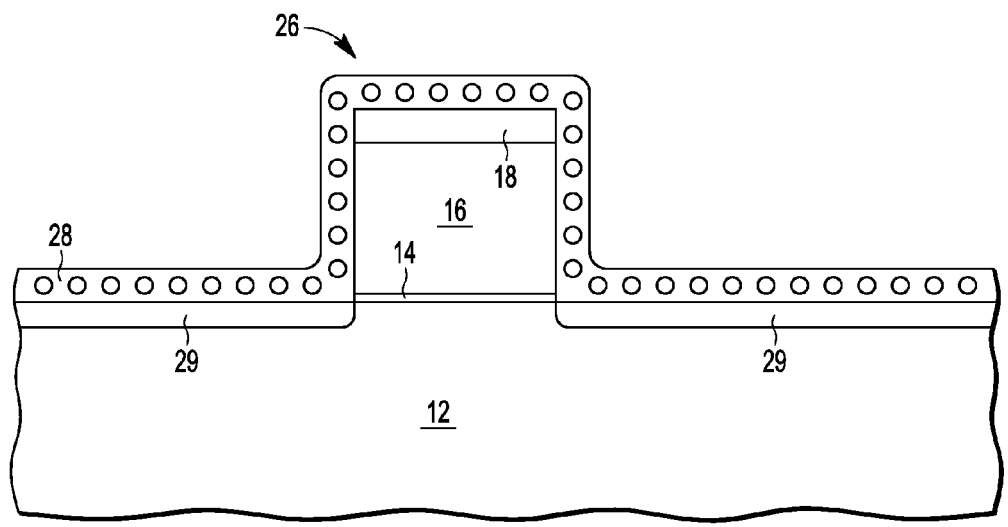

FIG. 5 illustrates a cross-sectional view of semiconductor device 10 after forming a charge storage layer 28. Charge storage layer 28 includes a plurality of nanocrystals for storing charge. The plurality of nanocrystals is isolated by an insulating material such as silicon dioxide. In one embodiment, charge storage layer 28 is formed in multiple layers (not shown), where a first dielectric layer is formed and nanocrystals are formed on the first dielectric layer. The nanocrystals may be formed from polysilicon, germanium, metal, or other suitable material. In another embodiment, nitrate may be used to form charge storage regions in charge storage layer 28. A second dielectric layer is formed over the nanocrystals to isolate the nanocrystals from subsequently formed layers. In one embodiment, charge storage layer 28 is about 200 angstroms thick.

Figure 6:
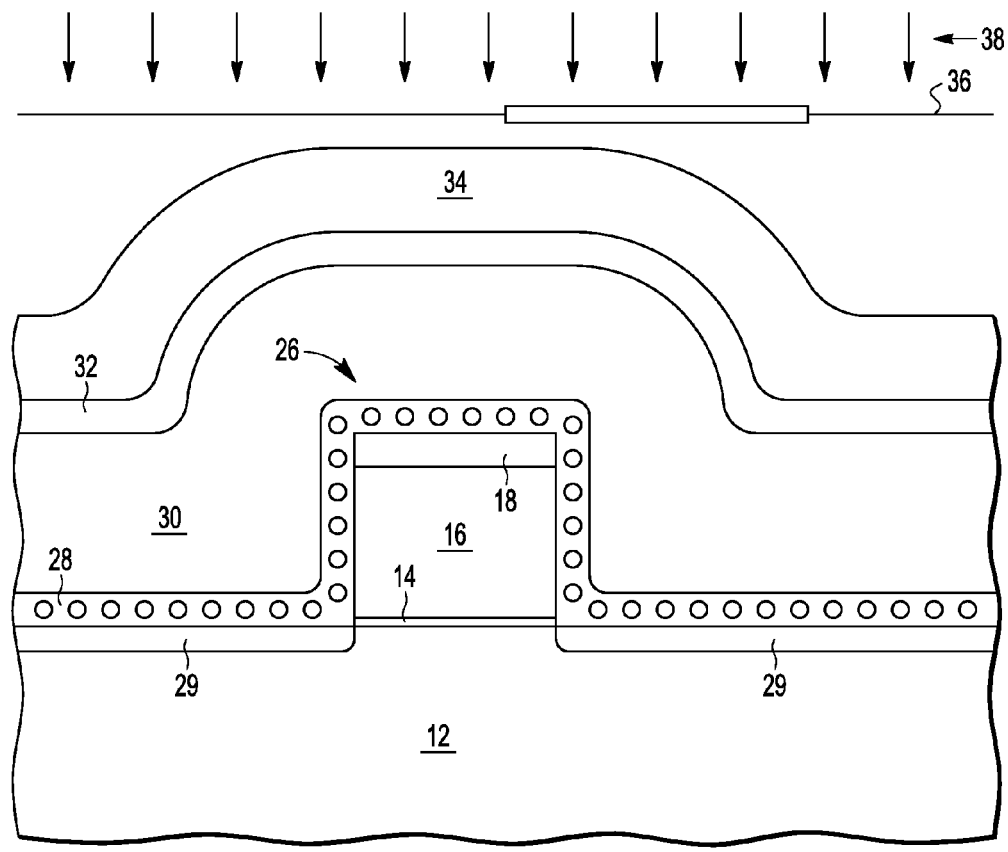

FIG. 6 illustrates a cross-sectional view of the semiconductor device after a second polysilicon layer 30 is formed over charge storage layer 28. Polysilicon layer 30 may be 1000 to 1500 angstroms thick. In one embodiment, polysilicon layer 30 is 1200 angstroms thick. A second ARC layer 32 is formed over the polysilicon layer 30. ARC layer 32 is a conventional ARC layer and may be organic or inorganic. Photoresist 34 is formed over ARC layer 32. A second photomask 36 is positioned over semiconductor device 10 for forming a control gate. Radiation 38 is applied to remove photoresist 34 from semiconductor device 10 except in areas covered by opaque portions of photomask 36. In one embodiment, radiation 36 is ultraviolet light used in a 193 nm lithography process.

Figure 7:
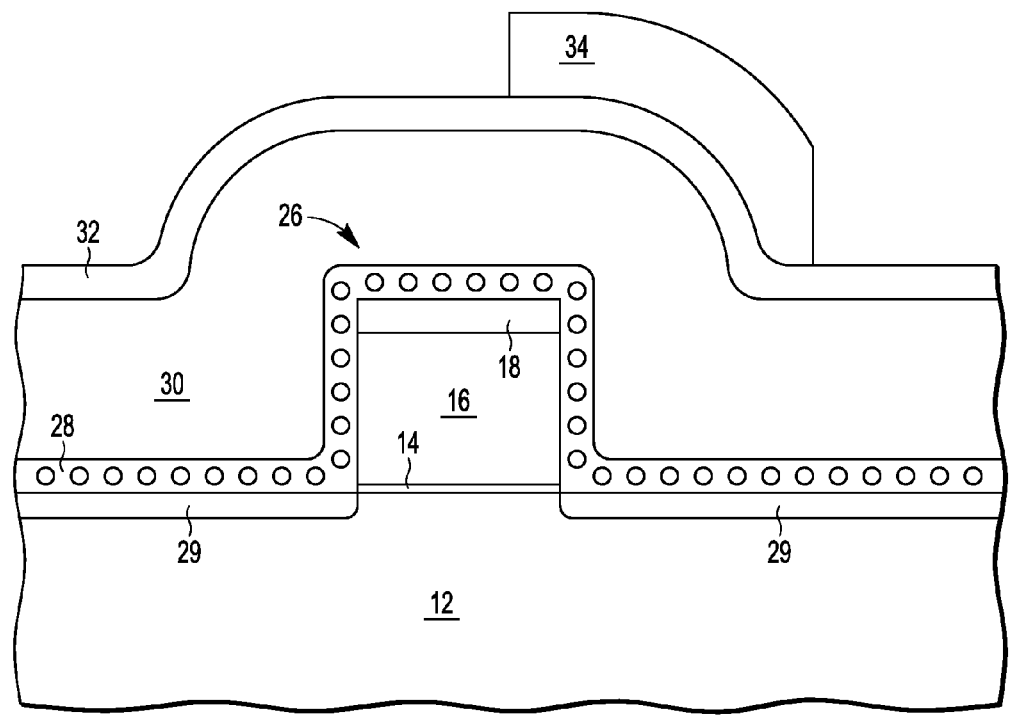

FIG. 7 illustrates a cross-sectional view of semiconductor device 10 after patterning photoresist layer 34 to form a patterned photoresist layer 34.

Figure 8:
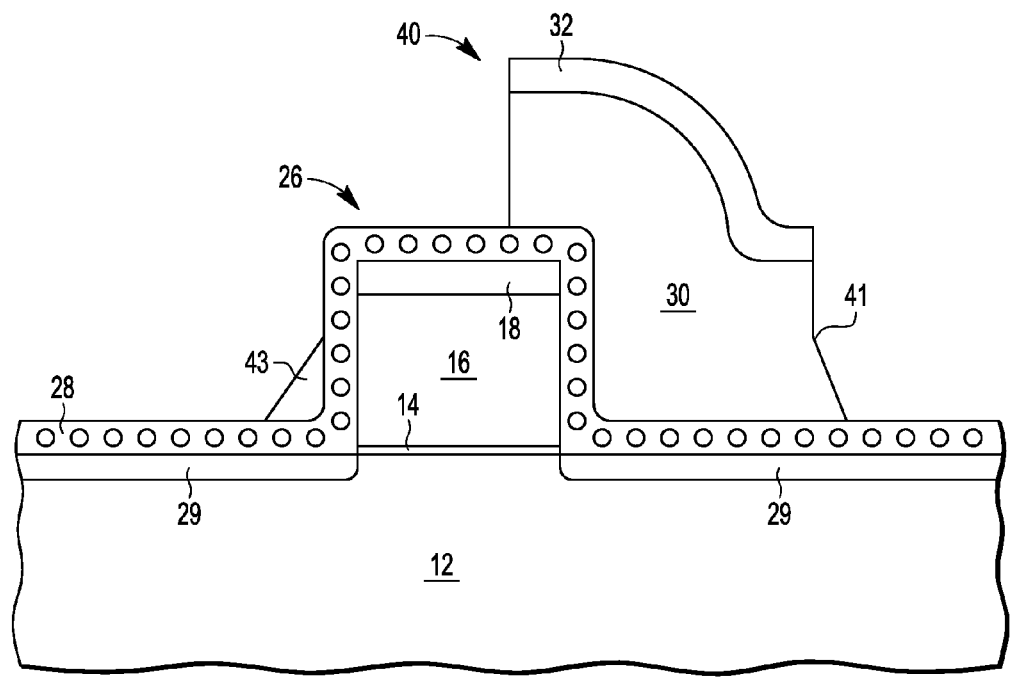

FIG. 8 illustrates a cross-sectional view of semiconductor device 10 after using a conventional anisotropic etching process to form a control gate 40 from polysilicon layer 30. ARC layer 32 may provide a hard mask during the anisotropic etching process. The anisotropic etching process creates a non-perpendicular sidewall 41. As can be seen in FIG. 8, an upper portion of sidewall 41 is substantially vertical and a bottom portion extends beyond the upper portion in a horizontal direction. The anisotropic etching process also results in residual portions of polysilicon on charge storage layer 28. As an example, a residual sidewall spacer 43 is illustrated on a side of select gate 26 opposite to sidewall 41. After the anisotropic etching process, an isotropic etching process is used. The isotropic etching process may be initiated by releasing an isotropic gas into a processing chamber (not shown) that is being used for the anisotropic etching process. The isotropic etching process makes the non-perpendicular sidewall substantially perpendicular.

Figure 9:
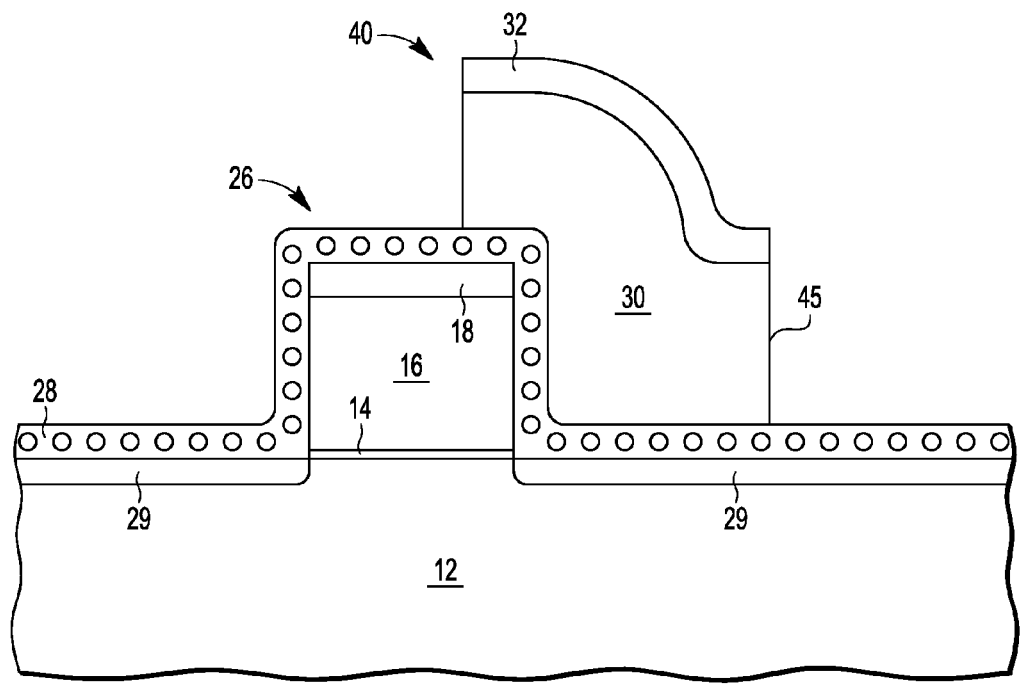

FIG. 9 illustrates a cross-sectional view of semiconductor device 10 after using the isotropic etching process to remove the bottom protruding portion of edge 41 (FIG. 8) to create a more vertical edge 45 of the control gate. Also, the inadvertent residual sidewall spacer 43 is removed.

Figure 10:
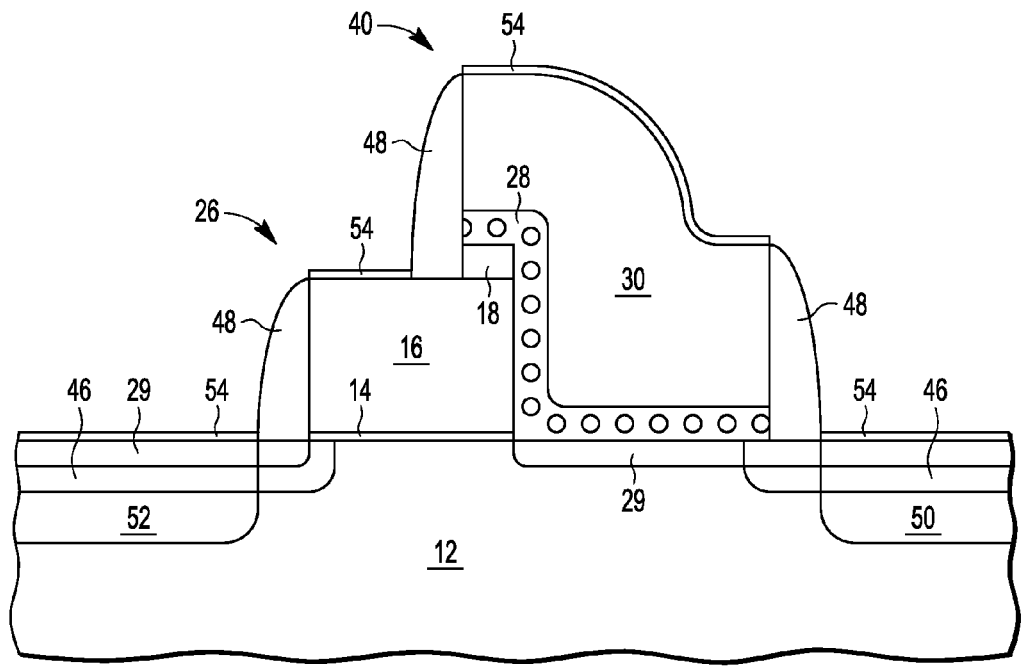

FIG. 10 illustrates a cross-sectional view of semiconductor device 10 after further processing to complete formation of a split-gate memory cell. ARC layer 18 is removed from the top of polysilicon layer 16 except where covered by an overlapping portion of polysilicon 30. Charge storage layer 28 is removed everywhere except where covered by control gate 40. As illustrated in FIG. 10, source and drain extensions 46 are formed on the left side of the select gate and on the right side of control gate 40. Sidewall spacers 48 are formed on the sides of polysilicon layer 16 and polysilicon layer 30. Also, a sidewall spacer 48 is formed on the left side of control gate 40. Then a doping material is diffused into substrate 12 to create a drain region 52. A doping material is diffused into substrate 12 to create a source region 50. The same doping material may be used to form both drain region 52 and source region 52. In another embodiment, the source and drain regions may be reversed. The exposed portions of substrate 12 and polysilicon layers 16 and 30 are silicided to form salicide layer 54. Source, drain, select gate, and control gate contacts are then formed on salicide layers 54 (not shown) as well as additional interconnect and protection layers.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device, the method comprising:
    forming a first semiconductor layer over a substrate;
    forming a first photoresist layer over the first semiconductor layer;
    using only a first single mask, patterning the first photoresist layer to form a first patterned photoresist layer;
    using the first patterned photoresist layer, etching the first semiconductor layer to form a select gate;
    forming a charge storage layer over the select gate and a portion of the substrate; forming a second semiconductor layer over the charge storage layer;
    forming a second photoresist layer over the second semiconductor layer;
    using only a second single mask patterning the second photoresist layer to form a second patterned photoresist layer;
    forming a control gate by anisotropically etching the second semiconductor layer and then subsequently, with the second patterned photoresist layer removed, isotropically etching the second semiconductor layer using etching processes that do not remove the charge storage layer, wherein a portion of the control gate overlaps the select gate, and wherein the method for forming the semiconductor device has only two masking steps; and
    after anisotropically etching and isotropically etching the second semiconductor layer to form the control gate, removing portions of the charge storage layer that are not covered by the control gate.

2. The method of claim 1 further comprising forming an anti-reflective coating (ARC) layer overlying the second semiconductor layer and using the ARC layer as a hard mask for anisotropically etching the second semiconductor layer.

3. The method of claim 1 further comprising prior to forming the first semiconductor layer over the substrate, forming a dielectric layer over the substrate.

4. The method of claim 1 further comprising:
    forming a first anti-reflective coating (ARC) layer overlying the first semiconductor layer;
    forming a second ARC layer overlying the second semiconductor layer; and using the second ARC layer as a hard mask for anisotropically etching the second semiconductor layer.

5. The method of claim 1, wherein the step of anisotropically etching the second semiconductor layer creates a sidewall of the second semiconductor layer, wherein the sidewall has a bottom portion and a top portion, and wherein the bottom portion extends beyond the top portion in a horizontal direction resulting in a non-perpendicular sidewall.

6. The method of claim 5, wherein the step of isotropically etching the second semiconductor layer makes the non-perpendicular sidewall substantially perpendicular.

7. The method of claim 1, wherein the control gate is located on a first side of the select gate and wherein the step of anisotropically etching the second semiconductor layer leaves a residual portion of the second semiconductor layer, wherein the residual portion of the second semiconductor layer is located on a second side of the select gate, wherein the second side is opposite to the first side.

8. The method of claim 7, wherein the step of isotropically etching the second semiconductor layer substantially removes the residual portion.

9. The method of claim 1, wherein the charge storage layer comprises nanocrystals.

10. A method of forming a semiconductor device, the method comprising:
    forming a first semiconductor layer over a substrate;
    forming a dielectric layer over the substrate and below the first semiconductor layer;
    forming a first photoresist layer over the first semiconductor layer;
    using only a first single mask patterning the first photoresist layer to form a first patterned photoresist layer;
    using the first patterned photoresist layer etching the first semiconductor layer and the dielectric layer to form a select gate;
    forming a charge storage layer over the select gate and a portion of the substrate;
    forming a second semiconductor layer over the charge storage layer;
    forming a second photoresist layer over the second semiconductor layer;
    using only a second single mask patterning the second photoresist layer to form a second patterned photoresist layer;
    forming a control gate by anisotropically etching the second semiconductor layer and then subsequently, with the second patterned photoresist layer removed, isotropically etching the second semiconductor layer, wherein a portion of the control gate overlaps with the select gate, wherein the step of anisotropically etching the second semiconductor layer creates a sidewall of the second semiconductor layer, wherein the sidewall has a bottom portion and a top portion, wherein the bottom portion extends beyond the top portion in a horizontal direction resulting in a non-perpendicular sidewall, wherein the step of isotropically etching the second semiconductor layer makes the non-perpendicular sidewall substantially perpendicular, wherein anisotropically etching and isotropically etching the second semiconductor layer does not remove the charge storage layer, and wherein the method for forming the semiconductor device has only two masking steps; and
    after anisotropically etching and isotropically etching the second semiconductor layer to form the control gate, removing portions of the charge storage layer that are not covered by the control gate.

11. The method of claim 10 further comprising forming an anti-reflective coating (ARC) layer overlying the second semiconductor layer and using the ARC layer as a hard mask for anisotropically etching the second semiconductor layer.

12. The method of claim 10 further comprising:
    forming a first anti-reflective coating (ARC) layer overlying the first semiconductor layer;
    forming a second ARC layer overlying the second semiconductor layer; and
    using the second ARC layer as a hard mask for anisotropically etching the second semiconductor layer.

13. The method of claim 10, wherein the control gate is located on a first side of the select gate and wherein the step of anisotropically etching the second semiconductor layer leaves a residual portion of the second semiconductor layer, wherein the residual portion of the second semiconductor layer is located on a second side of the select gate, wherein the second side is opposite to the first side.

14. The method of claim 13, wherein the step of isotropically etching the second semiconductor layer substantially removes the residual portion.

15. A method of forming a semiconductor device, the method comprising:
    forming a first semiconductor layer over a substrate;
    forming a dielectric layer over the substrate and below the first semiconductor layer;
    forming a first photoresist layer over the first semiconductor layer;
    using only a first single mask patterning the first photoresist layer to form a first patterned photoresist layer;
    using the first patterned photoresist layer etching the first semiconductor layer and the first dielectric layer to form a select gate;
    forming a charge storage layer over the select gate and a portion of the substrate; forming a second semiconductor layer over the charge storage layer;
    forming a second photoresist layer over the second semiconductor layer;
    using only a second single mask patterning the second photoresist layer to form a second patterned photoresist layer;
    forming a control gate by anisotropically etching the second semiconductor layer and then subsequently, with the second patterned photoresist layer removed, isotropically etching the second semiconductor layer, wherein a portion of the control gate overlaps with the select gate, wherein the control gate is located on a first side of the select gate: wherein the step of anisotropically etching the second semiconductor layer leaves a residual portion of the second semiconductor layer, wherein the residual portion of the second semiconductor layer is located on a second side of the select gate, wherein the second side is opposite to the first side, wherein the step of isotropically etching the second semiconductor layer substantially removes the residual portion, wherein anisotropically etching and isotropically etching the second semiconductor layer does not remove the charge storage layer, and wherein the method for forming the semiconductor device has only two masking steps; and
    after anisotropically etching and isotropically etching the second semiconductor layer to form the control gate, removing portions of the charge storage layer that are not covered by the control gate.

16. The method of claim 15 further comprising forming an anti-reflective coating (ARC) layer overlying the second semiconductor layer and using the ARC layer as a hard mask for anisotropically etching the second semiconductor layer.

17. The method of claim 15 further comprising:
forming a first anti-reflective coating (ARC) layer overlying the first semiconductor layer;
forming a second ARC layer overlying the second semiconductor layer; and
using the second ARC layer as a hard mask for anisotropically etching the second semiconductor layer.

18. The method of claim 15, wherein the step of anisotropically etching the second semiconductor layer creates a sidewall of the second semiconductor layer, wherein the sidewall has a bottom portion and a top portion, and wherein the bottom portion extends beyond the top portion in a horizontal direction resulting in a non-perpendicular sidewall.

19. The method of claim 18, wherein the step of isotropically etching the second semiconductor layer makes the non-perpendicular sidewall substantially perpendicular.

20. The method of claim 15, wherein the charge storage layer comprises nanocrystals.

* * * * *